(12) United States Patent
Wang et al.

(10) Patent No.: US 12,238,863 B2
(45) Date of Patent: Feb. 25, 2025

(54) ELECTRONIC DEVICE AND METHOD FOR FORMING THE SAME

(71) Applicant: InnoLux Corporation, Miao-Li County (TW)

(72) Inventors: Cheng-Chi Wang, Miao-Li County (TW); Kuan-Feng Lee, Miao-Li County (TW); Jui-Jen Yueh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 172 days.

(21) Appl. No.: 18/067,859

(22) Filed: Dec. 19, 2022

(65) Prior Publication Data

US 2024/0172361 A1 May 23, 2024

(30) Foreign Application Priority Data

Nov. 22, 2022 (CN) .......................... 202211473825.6

(51) Int. Cl.
| | |
|---|---|
| *H05K 1/02* | (2006.01) |
| *H05K 1/11* | (2006.01) |
| *H05K 3/40* | (2006.01) |
| *H10K 50/844* | (2023.01) |
| *H10K 59/122* | (2023.01) |

(Continued)

(52) U.S. Cl.
CPC ........... *H05K 1/115* (2013.01); *H05K 1/0271* (2013.01); *H05K 1/0274* (2013.01); *H05K 3/4038* (2013.01); *H05K 2201/096* (2013.01); *H05K 2201/09827* (2013.01)

(58) Field of Classification Search
CPC ........ H05K 1/02; H05K 1/0271; H05K 1/027; H05K 3/4038; H05K 2201/096; H05K 2201/09827; H10K 50/844; H10K 59/38; H10K 59/87; H10K 59/88; H10K 59/122; H10K 59/124; H10K 59/131; H10B 63/84;

(Continued)

(56) References Cited

U.S. PATENT DOCUMENTS

| | | | |
|---|---|---|---|
| 10,347,598 B2 | 7/2019 | Baek et al. | |
| 2012/0292621 A1* | 11/2012 | Kim | H10K 59/122 |
| | | | 438/34 |

(Continued)

FOREIGN PATENT DOCUMENTS

| | | |
|---|---|---|
| CN | 110870066 A | 3/2020 |
| CN | 108807332 B | 7/2020 |
| TW | 201807793 A | 3/2018 |

OTHER PUBLICATIONS

Chinese language office action dated Nov. 14, 2024, issued in application No. TW 111144550.

*Primary Examiner* — Xiaoliang Chen
(74) *Attorney, Agent, or Firm* — McClure, Qualey & Rodack, LLP

(57) ABSTRACT

An electronic device is provided. The electronic device includes a substrate structure, a control unit, a first circuit structure, and an electronic unit. The substrate structure has a conductive via pattern and a dummy via pattern. The control unit is electrically connected to the conductive via pattern. The first circuit structure is electrically connected to the conductive via pattern. The electronic unit is electrically connected to the control unit through the first circuit structure. The dummy via pattern is electrically insulated from the first circuit structure.

20 Claims, 10 Drawing Sheets

(51) Int. Cl.
  *H10K 59/124* (2023.01)
  *H10K 59/131* (2023.01)
  *H10K 59/38* (2023.01)
  *H10K 59/88* (2023.01)

(58) Field of Classification Search
  CPC .. H10B 63/845; H10N 70/021; H10N 70/826; H01L 23/5226
  USPC .... 361/760; 257/40, 59, 72, 51.003, 51.018; 438/34
  See application file for complete search history.

(56) References Cited

U.S. PATENT DOCUMENTS

| | | |
|---|---|---|
| 2018/0197827 A1 | 7/2018 | Lee et al. |
| 2020/0381508 A1* | 12/2020 | Jeon ........................ H10K 59/87 |
| 2021/0375833 A1 | 12/2021 | Lee et al. |
| 2023/0307025 A1* | 9/2023 | Russell ................ H10N 70/826 |

* cited by examiner

ELECTRONIC DEVICE AND METHOD FOR FORMING THE SAME

CROSS REFERENCE TO RELATED APPLICATIONS

This application claims priority of China Patent Application No. 202211473825.6 filed on Nov. 22, 2022, the entirety of which are incorporated by reference herein.

BACKGROUND

Technical Field

The present disclosure relates to an electronic device, and in particular it relates to an electronic device including a dummy via pattern.

Description of the Related Art

With the continuous progress of the application of electronic devices, the development of display technology is also changing with each passing day. However, in the face of different manufacturing technical conditions, the requirements for the structure and quality of electronic devices are getting higher and higher, so that the manufacturing of electronic devices faces different challenges.

In the packaging technology of electronic elements, fan-out wafer-level package (FOWLP) and fan-out panel-level fan-out package (FOPLP) include electronic elements and redistribution layers formed on wafer-level substrates or panel-level substrates, followed by packaging and dicing steps for simultaneously forming a large number of packaged elements. However, in such packaging elements, due to the difference in thickness of the film layers on both sides of the substrate, it is prone to cause the substrate to warp due to uneven stress, which affects the yield of electronic components.

In summary, although the existing packaging structures can roughly meet their originally intended purposes, they still do not fully meet the requirements placed on them in all respects. For example, how to prevent uneven stress while manufacturing a packaging structure that meets electrical requirements is still a topic of research in the industry. Therefore, the research and development of electronic devices requires continuous updates and adjustments to solve various problems faced by the manufacturers of electronic devices.

BRIEF SUMMARY

The present disclosure provides an electronic device. The electronic device includes a substrate structure, a control unit, a first circuit structure, and an electronic unit. The substrate structure has a conductive via pattern and a dummy via pattern. The control unit is electrically connected to the conductive via pattern. The first circuit structure is electrically connected to the conductive via pattern. The electronic unit is electrically connected to the control unit through the first circuit structure. The dummy via pattern is electrically insulated from the first circuit structure.

The present disclosure provides a method for forming an electronic device. The method includes forming a substrate structure having a conductive via pattern and a dummy via pattern. The method further includes forming a control unit electrically connected to the conductive via pattern. The method further includes forming a first circuit structure electrically connected to the conductive via pattern. The method further includes disposing an electronic unit on the first circuit structure. The electronic unit is electrically connected to the control unit through the first circuit structure. The dummy via pattern is electrically insulated from the first circuit structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion

DETAILED DESCRIPTION

Figure 1:
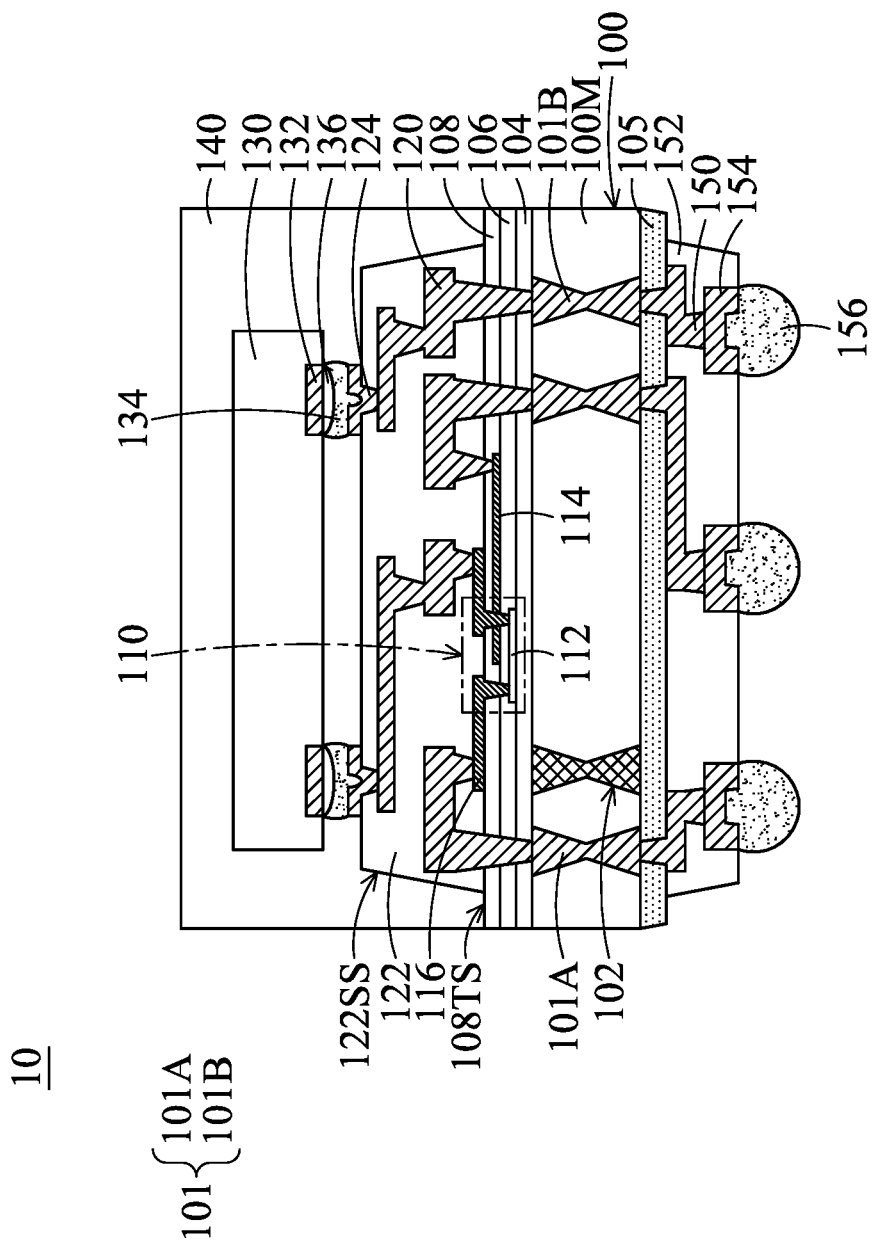
FIG. 1 illustrates a cross-sectional view of an electronic device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by those skilled in the art to which this disclosure belongs. It can be understood that these terms, such as those defined in commonly used dictionaries, should be interpreted as having meanings consistent with the background or context of the related technology and the present disclosure, and should not be interpreted in an idealized or overly formal manner, unless otherwise specified in the disclosed embodiments.

The terms "about", "equal", "equal to" or "same", "substantially" or "roughly" are generally interpreted as within 20% of a given value or range, or as within 10%, 5%, 3%, 2%, 1%, or 0.5% of a given value or range. It should be noted that the amounts provided in the specification are approximate amounts, which means that even "about", "approximate", or "substantially" are not specified, the meanings of "about", "approximate", or "substantially" are still implied.

It should be noted that, in the following embodiments, the features of several different embodiments may be replaced, recombined, and mixed to complete other embodiments without departing from the spirit of the present disclosure. As long as the features of the various embodiments do not violate the spirit of the disclosure or conflict with each other, they can be mixed and matched arbitrarily.

Some embodiments of the disclosure are described below, and additional steps may be provided before, during, and/or after the various stages described in these embodiments. Some of the described stages may be replaced or eliminated in different embodiments. Semiconductor device structures may add additional components. Some of the described components may be replaced or eliminated in different embodiments. Although some of the embodiments discussed are performed in a particular order of steps, the steps may be performed in another logical order.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±10% of a target (or intended) value.

It should be understood that the electronic device of the present disclosure may include a semiconductor device, a semiconductor packaging device, a display device, a radar device, a LIDAR device, an antenna device, a touch display device, a curved display device or a non-rectangular display device (free shape display), but not limited to this. The electronic device may be a bendable or flexible electronic device. The electronic device may include, for example, but not limited to, light-emitting diodes, liquid crystals, fluorescence, phosphors, other suitable display media, or a combination thereof. The light-emitting diodes may include, for example, organic light-emitting diodes (OLEDs), inorganic light-emitting diodes (LEDs), mini-light-emitting diodes (mini LEDs), micro-light-emitting diodes (micro-LEDs), quantum dots (QDs) light-emitting diodes (such as QLEDs, QDLEDs), other suitable materials or an arbitrary combination thereof, but not limited to. The display device may include, for example, but is not limited to, a tiled display device. The concepts or principles of the present disclosure may also be applied to a non-self-luminous liquid crystal display (LCD), but are not limited thereto.

The antenna device may be, for example, a 5G antenna, a Beyond-5G antenna, a 6G antenna, a liquid crystal antenna or other kinds of antennas, but is not limited thereto. The antenna device may include, for example, but is not limited to, a tiled antenna device. It should be noted that, the electronic device may be any arrangement or combination of the foregoing, but not limited to this. In addition, the shape of the electronic device may be rectangular, circular, polygonal, a shape with curved edges, or other suitable shapes. The electronic device may have peripheral systems such as a driving system, a control system, a light source system, and a shelf system to support the display device, the antenna device or the tiled device. The electronic device of the present disclosure may be, for example, a display device, but is not limited thereto.

The present disclosure provides an electronic device and a method for forming the same. By forming a dummy via pattern in a substrate structure, the substrate structure can be prevented from warping due to uneven stress. Compared with conventional packaging structures of electronic devices, the electronic device disclosed in this disclosure can maintain the stability of the substrate structure without affecting the electrical requirements, and packaging structures formed by such electronic device may improve the functionality of the electronic unit through a via structure and a control unit. In addition, the formation of a dummy via structure electrically insulated from a circuit structure can be integrated into the fabrication process of a conductive via pattern. Therefore, the formation method of the present disclosure can manufacture electronic devices with better electrical and structural properties, or do not need to perform complicated manufacturing steps, thereby saving manufacturing costs.

FIG. 1 illustrates a cross-sectional view of an electronic device 10 according to some embodiments of the present disclosure. The electronic device 10 includes a substrate structure 100, a control unit 110, a first circuit structure 120, and an electronic unit 130. The substrate structure 100 has a conductive via pattern 101 and a dummy via pattern 102. The control unit 110 is electrically connected to the conductive via pattern 101, the first circuit structure 120 is electrically connected to the conductive via pattern 101, and the electronic unit 130 is electrically connected to the control unit 110 through the first circuit structure 120. The dummy via pattern 102 is electrically insulated from the first circuit structure 120. According to some embodiments, the electronic device 10 may include at least one control unit 110 and at least one electronic unit 130, but the number of which is not limited.

As shown in FIG. 1, the substrate structure 100 may include a substrate material 100M and the conductive via pattern 101 and the dummy via pattern 102 disposed in the substrate material 100M. The substrate material 100M may include hard or soft materials, such as glass, ceramics, polyimide (PI), polyethylene terephthalate (PET), steel plate, silicon base, other suitable materials, or a combination of the above materials, but not limited to.

The substrate structure 100 may include a transparent material or a translucent material. For example, in some embodiments, the substrate structure 100 has a through-glass via (TGV) structure, which includes the substrate material 100M having an inorganic and amorphous glass material, and a conductive via material is disposed in the substrate material 100M. For example, the substrate structure 100 including transparent material or translucent material can be used for processing from the other side of the component to be processed, such as laser processing, and is beneficial for the alignment of the circuit structures and elements on both sides, but not limited to this. According to some embodiments, the substrate structure 100 may include an opaque substrate, which can be processed on the other side through the configuration of alignment marks.

In some embodiments, the conductive via pattern 101 includes a first conductive via 101A and a second conductive via 101B. As shown in FIG. 1, the first conductive via 101A may be electrically connected to the control unit 110 through the first circuit structure 120, and the second conductive via 101B may be electrically connected to the electronic unit 130 through a portion of the first circuit structure 120 separated from the control unit 110. However, the present disclosure is not limited thereto. In other embodiments, the control unit 110 and the electronic unit 130 may be electrically connected to a common conductive via through the first circuit structure 120.

By disposing the dummy via pattern 102 in the substrate structure 100, the substrate structure 100 can be prevented from warping due to uneven stress. Compared with packaging structures of conventional electronic devices, the electronic device 10 including the dummy via pattern 102 can maintain the stability of the substrate structure 100 without affecting the electrical requirements of the conductive via pattern 101. Although the dummy via pattern 102 passing through the substrate material M is shown in FIG. 1, the present disclosure is not limited thereto. In some embodiments, the dummy via pattern 102 is embedded in the substrate material M, and a top surface or a bottom surface of the dummy via pattern 102 is covered by the substrate material M. It should be understood that the present disclosure does not specifically limit the number, cross-sectional shape, and horizontal position of the vias included in the dummy via pattern 102. For example, the conductive via 101 may be an I/O (input/output point) of an electronic device. When the number of I/O of the substrate is uneven, it may cause uneven stress on the substrate, thereby causing warpage. Therefore, the stress can be balanced by disposing the dummy via pattern 102 appropriately, but not limited thereto.

The material of the conductive via pattern 101 may include, for example, copper (Cu), tin (Sn), nickel (Ni), silver Ag), gold (Au), titanium (Ti), molybdenum (Mo), tungsten (W), aluminum (Al), other suitable conductive materials, or combinations thereof, but not limited thereto. The dummy via pattern 102 may include the same or similar material as the conductive via pattern 101, but the disclosure is not limited thereto. In some embodiments, at least a portion of the dummy via pattern 102 includes an insulating material. For example, the parasitic capacitance can be reduced or the electrical interference caused to the nearby conductive via patterns 101 or circuit structures can be reduced, but not limited thereto.

The control unit 110 may be an element for controlling the electronic unit 130, for example, a control element including a transistor. In some embodiments, the control unit 110 may be a thin film transistor (TFT) element. The control unit 110 may include a semiconductor layer 112, a gate 114, and a source/drain 116. It should be noted that the aspect of the control unit 110 is not limited in this disclosure. For example, the control unit 110 may have top-gated, bottom-gated, or other suitable aspects, but is not limited thereto. In some embodiments, as shown in FIG. 1, the control element 110 may be located above the substrate structure 100, and the control unit 110 is located between the substrate structure 100 and the first circuit structure 120. In addition, the semiconductor layer 112, the gate 114, and the source/drain 116 may be fully or partially embedded in a first insulating layer 106 and a second insulating layer 108. In some embodiments, as shown in FIG. 1, a top surface of the source/drain 116 is exposed above the second insulating layer 108.

The material of the semiconductor layer 112 may include amorphous silicon, polysilicon, indium gallium zinc oxide (IGZO), other suitable semiconductor materials, or a combination thereof, but is not limited thereto. The material of the gate 114 may include Al, Ti, Mo, W, other suitable conductive materials, or a combination thereof, but is not limited thereto. The material of the source/drain 116 may include Al, Ti, Mo, W, other suitable conductive materials, or a combination thereof, but is not limited thereto. In some embodiments, the first insulating layer 106 and the second insulating layer 108 may include the same or similar material. Materials of the first insulating layer 106 and the second insulating layer 108 may include silicon nitride ($SiN_x$), silicon oxide ($SiO_x$), silicon oxynitride ($SiO_xN_y$), aluminum oxide ($Al_xO_y$), other suitable insulating materials, or a combination thereof, but not limited thereto. According to some embodiments, the thicknesses of the first insulating layer 106 and the second insulating layer 108 are greater than or equal to 500 nanometers (nm) and less than or equal to 5000 nm.

In some embodiments, the electronic device 10 further includes a buffer layer 104 disposed between the substrate structure 100 and the control unit 110. As shown in FIG. 1, the buffer layer 104 may cover the top surface of the dummy via pattern 102. Since the material (such as copper) in the conductive via pattern 101 may diffuse to the control unit 110 at high temperature, by disposing the buffer layer 104, the diffusion of the above material can be substantially blocked during high temperature processes to prevent the control unit 110 from being polluted. In some embodiments, to achieve the above purpose, the thickness of the buffer layer 104 is between about 400 nanometers (nm) and about 1500 nanometers (nm). In some embodiments, as shown in FIG. 1, the first circuit structure 120 penetrates through the buffer layer 104 to be electrically connected to the conductive via pattern 101. The material of the buffer layer 104 may include silicon nitride, silicon oxide, silicon oxynitride, aluminum oxide, other suitable insulating materials, or a combination thereof, but is not limited thereto.

In some embodiments, the electronic device 10 further includes a stress adjustment layer 105 disposed on the substrate structure 100 and located on the side of the substrate structure 100 opposite to the control unit 110. As shown in FIG. 1, the stress adjustment layer 105 may cover the bottom surface of the dummy via pattern 102. By disposing the stress adjustment layer 105 on the substrate structure 100, the stability of the substrate structure 100 can be further maintained when depositing components on the other side of the substrate structure 100 (such as the control unit 110, the first circuit structure 120, and the electronic unit 130, etc.). The stress is balanced to avoid warping of the substrate structure 100. In some embodiments, the coefficient of thermal expansion of the stress adjustment layer 105 is close to that of the insulating layers on the other side of the substrate structure 100, and the insulating layers on the other side includes, for example, the buffer layer 104, the first insulating layer 106, and the second insulating layer 108, etc. The material of the stress adjustment layer 105 may include silicon nitride, silicon oxide, silicon oxynitride, aluminum oxide, other suitable insulating materials, or a combination thereof, but is not limited thereto. The thickness of the stress adjustment layer 105 may be between 800 nanometers (nm) and about 3000 nanometers (nm).

Referring to FIG. 1, the first circuit structure 120 is surrounded by a first dielectric layer 122. The material of the first circuit structure 120 may include a material similar to that of the conductive via pattern 101, such as Cu, Sn, Ni, Ag, Au, Ti, Mo, W, other suitable conductive materials, or a combination thereof, but not limited to this. The material of the first dielectric layer 122 may include polyimide (PI), polybenzoxazole PBO), benzocyclobutene (BCB), build-up material ABF (Ajinomoto Build-up Film), epoxy resin, other suitable dielectric materials, or a combination thereof, but not limited thereto.

In some embodiments, the electronic device 10 further includes an alignment component 124 disposed on the first circuit structure 120 and electrically connected to the electronic unit 130. As shown in FIG. 1, the alignment member 124 may have a cavity facing the electronic unit 130. The alignment component 124 may be used to align the electronic unit 130 to a designated position above the first circuit structure 120. In addition, by increasing the lateral stress that the electronic unit 130 can bear, the cavity of the alignment component 124 can be used to enhance the bonding strength between the first circuit structure 120 and the electronic unit 130. The alignment component 124 may include a material similar to that of the first circuit structure 120, but is not limited thereto. According to some embodiments, the alignment component 124 may be, for example, an under bump metallization (UBM), but not limited thereto.

The electronic unit 130 and the first circuit structure 120 may be electrically connected through a bonding material 134. In some embodiments, as shown in FIG. 1, the bonding material 134 is disposed on the alignment component 124 on the first circuit structure 120, and the electronic unit 130 having an electrical connection portion 132 is disposed on the bonding material 134. In some embodiments, there is a diffusion region 136 between the electrical connection portion 132 and the bonding material 134, and the diffusion region 136 includes elements from the electrical connection portion 132 and the bonding material 134.

The material of the bonding material 134 may include, for example, Au, Sn, Al, Cu, Ti, Ag, Ga, other suitable metals, or combinations thereof, but is not limited thereto. In some embodiments, the material of the bonding material 134 includes a mixture of particles of aforementioned metals and organic materials. The material of the electrical connection portion 132 includes Cu, Sn, Ni, Ag, Au, Ti, Mo, W, other suitable conductive materials, or a combination thereof, but is not limited thereto.

Depending on the application of the electronic device 10, the electronic unit 130 may be various elements. For example, the electronic unit 130 may be a chip, a die, an integrated circuit, a diode, a capacitor, a resistor, an inductor, a sensing element, other suitable elements, or a combination thereof, but not limited thereto. The electronic device 10 further includes a protection layer 140 surrounding the electronic unit 130. For example, the protection layer 140 can prevent moisture from affecting the electronic unit 130 or the circuit structure. According to some embodiments, the protection layer 140 may be in contact with at least two sides of the electronic unit 130. According to some embodiments, at least one surface of the electronic unit 130 may be exposed but not in contact with the protection layer 140. The material of the protection layer 140 may include silicone resin, epoxy resin, acrylic glue, other suitable materials, or a combination thereof, but is not limited thereto.

According to some embodiments, the protection layer 140 may be in contact with a side surface 122SS of the first dielectric layer 122. The protection layer 140 may also be in contact with a top surface 108TS of the insulating layer 108. Though the above configuration, the adhesion between different layers can be improved, which further improves the reliability of the electronic device, but not limited to.

In some embodiments, the electronic device 10 further includes a second circuit structure 150 disposed on the substrate structure 100 and opposite to the first circuit structure 120. In some embodiments, the dummy via pattern 102 is electrically insulated from the second circuit structure 150. As shown in FIG. 1, for example, the dummy via pattern 102 and the second circuit structure 150 may be separated by the stress adjustment layer 105. In some embodiments, the second circuit structure 150 penetrates through the stress adjustment layer 105 to be electrically connected to the conductive via pattern 101. In some embodiments, the first circuit structure 120 is electrically connected to the second circuit structure 150 through the conductive via pattern 101. In some embodiments, the second circuit structure 150 is surrounded by a second dielectric layer 152. The second dielectric layer 152 may include a material similar to that of the first dielectric layer 122, such as polyimide (PI), polybenzoxazole (PBO), benzocyclobutene (BCB), epoxy resin, ABF, other suitable dielectric materials, or a combination thereof, but not limited thereto.

In some embodiments, the electronic device 10 further includes an alignment component 154 disposed on the second circuit structure 150. As shown in FIG. 1, the alignment component 154 may have a cavity facing away from the substrate structure 100. The alignment component 154 may be used to align the electronic device 10 to a designated location of an external circuit. In addition, cavity of the alignment member 154 can be used to enhance the bonding strength between the electronic device 10 and the external circuit. The alignment component 154 may include a material similar to that of the alignment component 124 or the second circuit structure 150, but not limited thereto. In some embodiments, as shown in FIG. 1, a bonding material 156 is disposed on the alignment component 154 on the second circuit structure 150, and the bonding material 156 can be used to bond the electronic device 10 to the external circuit. The aforementioned external circuit may include a printed circuit board (PCB) or a flexible printed circuit (FPC) board. For example, the first circuit structure 120 and the second circuit structure 150 may be, for example, a redistribution layer (RDL). Through the design of the redistribution layer, it is possible to flexibly design I/O or increase the fan-out range of the circuit structure. According to some embodiments, the alignment component 124 or the alignment component 154 may have a convex surface, a flat surface, a concave surface, or an arc surface, but not limited thereto. According to some embodiments, a surface of the alignment component 124 may be coplanar with or different from a surface of the dielectric layer 122. In detail, the surface of the alignment component 124 may be higher than the surface of the dielectric layer 122 or the surface of the alignment component 124 may be lower than the surface of the dielectric layer 122. According to some embodiments, a surface of the alignment component 154 may be coplanar with or different from a surface of the dielectric layer 152. In detail, the surface of the alignment component 154 may be higher than the surface of the dielectric layer 152 or the surface of the alignment component 154 may be lower than the surface of the dielectric layer 152.

Figure 2:
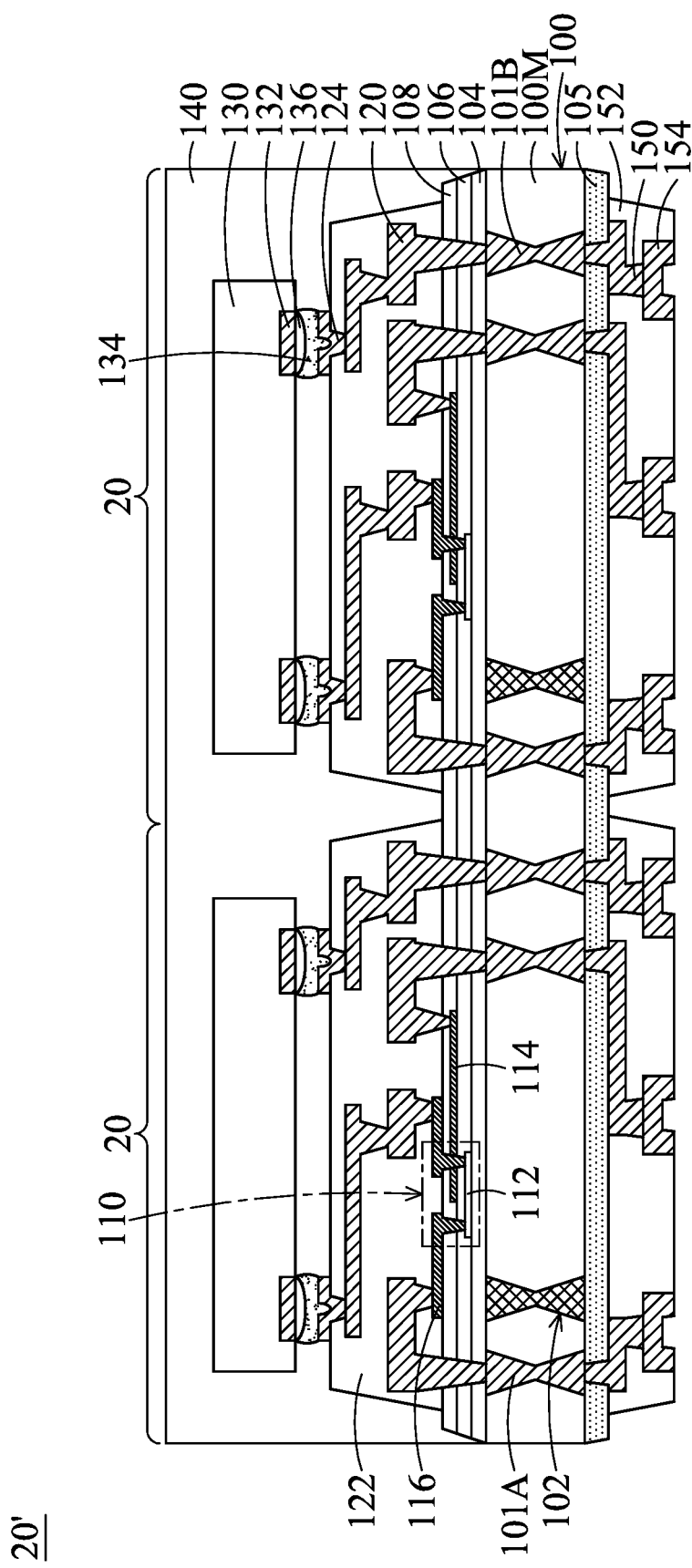
FIG. 2 illustrates a cross-sectional view of an electronic device array according to some embodiments of the present disclosure.
Figure 3:
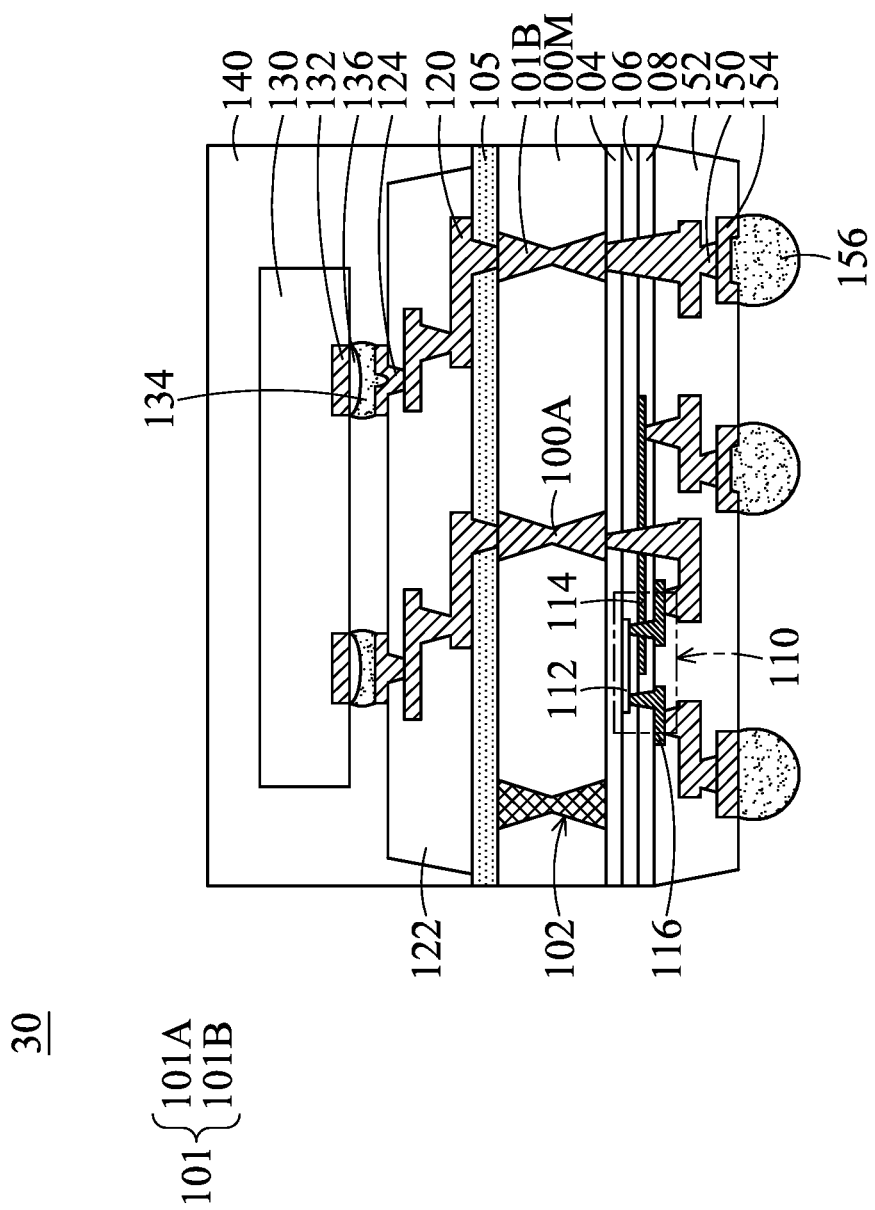
FIG. 3 illustrates a cross-sectional view of an electronic device according to some other embodiments of the present disclosure.

FIG. 2 illustrates a cross-sectional view of an electronic device array 20' according to some embodiments of the present disclosure. FIG. 2 shows an electronic device array 20' including two electronic devices 20, and each electronic device 20 has an electronic unit 130 and its corresponding first circuit structure 120, control unit 110, and second circuit structure 150. In fact, the present disclosure does not limit the number of the electronic devices 20 included in the electronic device array 20' and the configuration of each electronic device 20. For example, the electronic devices 20 may have a configuration similar to that of the electronic device 10 described with reference to FIG. 1, and may also have a configuration where the control unit 110 and the electronic unit 130 are located on different sides of the substrate structure 100 (as shown in FIG. 3). In addition, depending on the design requirements of the electronic device array 20', each electronic unit 130 may be the same, similar, or different kinds of elements, which is not limited in this disclosure. In some embodiments, there are connected conductive traces between the circuit structures of adjacent electronic devices 20. Similar elements shown in FIGS. 1 and 2 are denoted by the same or similar reference numerals and may be formed with the same or similar materials and configurations, and detailed descriptions thereof are omitted here for simplicity.

FIG. 3 illustrates a cross-sectional view of an electronic device 30 according to some other embodiments of the present disclosure. The difference from the electronic device shown in FIG. 1 is that the control unit 110 and the electronic unit 130 of the electronic device 30 are located on different sides of the substrate structure 100. That is, as shown in FIG. 3, the control unit 110 is located below the substrate structure 100, and the substrate structure 100 is located between the control unit 110 and the first circuit structure 120. For example, through the above configuration, the control unit 110 can be prevented from interfering with the electronic unit 130 during operation, but it is not limited thereto.

In addition, in the embodiment shown in FIG. 3, since the buffer layer 104 is disposed between the substrate structure 100 and the control unit 110, the buffer layer 104 is also located below the substrate structure 100. The stress adjustment layer 105 may be disposed on the side of the substrate structure 100 opposite to the control unit 110 such that the stress adjustment layer 105 is located between the substrate structure 100 and the electronic unit 130. Similar elements shown in FIGS. 1 and 3 are denoted by the same or similar reference numerals and may be formed with the same or similar materials and configurations, and detailed descriptions thereof are omitted here for simplicity.

Figure 4:
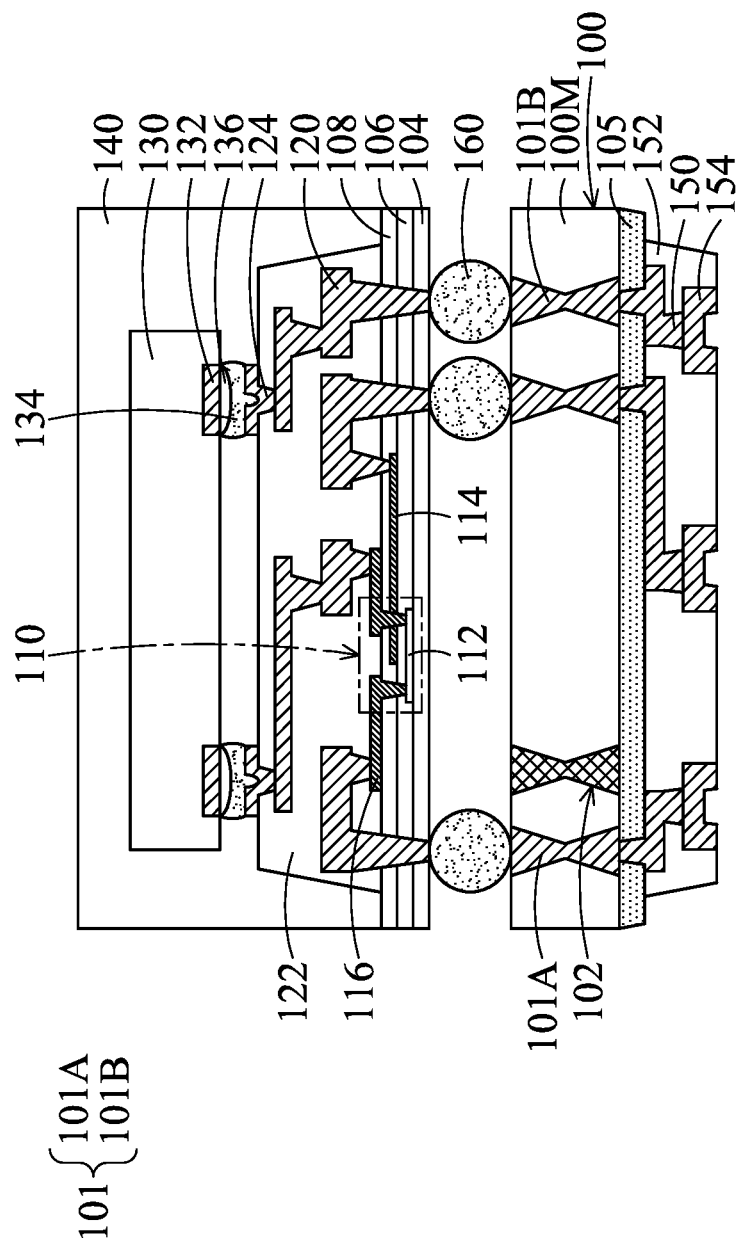
FIG. 4 illustrates a cross-sectional view of an electronic device according to some other embodiments of the present disclosure.

FIG. 4 illustrates a cross-sectional view of an electronic device 40 according to some other embodiments of the present disclosure. The difference from the electronic device shown in FIG. 1 is that a conductive material 160 is disposed between the substrate structure 100 and the first circuit structure 120 of the electronic device 40. The substrate structure 100 of the electronic device 40 is electrically connected to the first circuit structure 120 through the conductive material 160. The conductive material 160 may include materials similar to those of the first circuit structure 120 and the second circuit structure 150, but is not limited thereto. In addition, similar elements shown in FIGS. 1 and 4 are denoted by the same or similar reference numerals and may be formed with the same or similar materials and configurations, and detailed descriptions thereof are omitted here for simplicity. By forming such electronic device 40, the original process complexity of forming the first circuit structure 120 and the second circuit structure 150 on the upper and lower sides of the substrate structure 100 can be reduced.

FIGS. 5A-5F illustrate cross-sectional views of various stages of a manufacturing process of an electronic device according to some embodiments of the present disclosure.

Figure 5A:
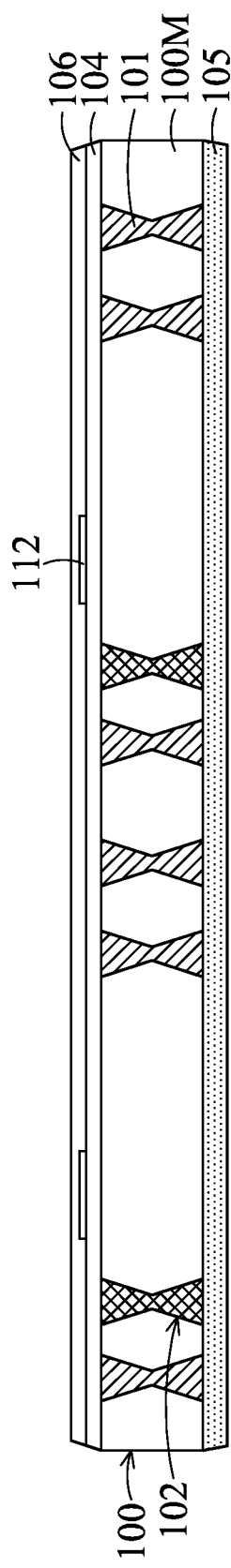
FIGS. 5A-5F illustrate cross-sectional views of various stages of a manufacturing process of an electronic device according to some embodiments of the present disclosure.

Referring to FIG. 5A, firstly, a substrate structure 100 having a conductive via pattern 101 and a dummy via pattern 102 is formed. In some embodiments, multiple via holes are formed in a substrate material 100M using a removal process, and then materials for the conductive via pattern 101 and the dummy via pattern 102 are deposited within the via holes.

The above-mentioned removal process may include laser processing, a suitable etching process, or a combination thereof, but is not limited thereto. In an embodiment where the thickness of the substrate material 100M is relatively thick, laser processing may be performed from both sides of the substrate material 100M to form via holes with larger diameters at the top and bottom and smaller diameters in the middle. In this case, the resulted conductive via pattern 101 and dummy via pattern 102 have larger diameters at the top and bottom and smaller diameters at the middle, as shown in FIG. 5A.

The process for depositing the conductive via pattern 101 may include, for example, physical vapor deposition (PVD), chemical vapor deposition (CVD), atomic layer deposition (ALD), electroplating, other suitable processes, or a combination thereof, but not limited thereto. In some embodiments, the formation of the conductive via pattern 101 includes firstly depositing a seed layer in the via hole, and then depositing a conductive material on the seed layer. The material of the above-mentioned seed layer includes titanium (Ti), copper (Cu), other suitable conductive materials, or a combination thereof, but is not limited thereto. The aforementioned conductive materials include, for example, Cu, Sn, Ni, Ag, Au, Ti, Mo, W, other suitable conductive materials, or combinations thereof, but are not limited thereto.

The process for depositing the dummy via pattern 102 may include, for example, physical vapor deposition (PVD), chemical vapor deposition (CVD), atomic layer deposition (ALD), electroplating, other suitable processes, or combinations thereof, but not limited to this. In some embodiments, the conductive via pattern 101 and the dummy via pattern 102 are formed simultaneously in a deposition process. In fact, the dummy via pattern 102 may also be formed in a different deposition process from the conductive via pattern 101, and the dummy via pattern 102 may also include a different material from the conductive via pattern 101.

Next, as shown in FIG. 5A, a buffer layer 104 covering a top surface of the dummy via pattern 102 may be formed on the substrate structure 100 before forming the control unit. In this way, the material from the conductive via pattern 101 can be prevented from diffusing to the control unit 110 in the subsequent high temperature process. Moreover, a stress adjustment layer 105 may be formed on the substrate structure 100 and on the side opposite to the buffer layer 104, wherein the thickness of the stress adjustment layer 105 is greater than that of the buffer layer 104.

The process for depositing the buffer layer 104 may include, for example, physical vapor deposition (PVD), chemical vapor deposition (CVD), atomic layer deposition (ALD), other suitable processes, or a combination thereof, but not limited to this. The process for depositing the stress adjustment layer 105 may be similar to that for depositing the buffer layer 104, including, for example, physical vapor deposition (PVD), chemical vapor deposition (CVD), atomic layer deposition (ALD), other suitable processes, or a combination thereof, but not limited to this.

Figure 5B:
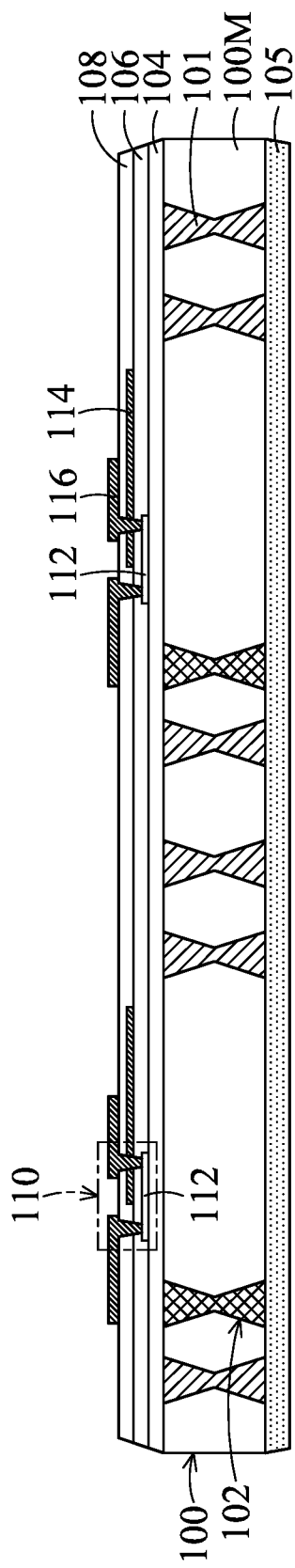

Next, a control unit 110 electrically connected to the conductive via pattern 101 is formed. Referring to FIGS. 5A and 5B, firstly, a semiconductor layer 112 of the control unit 110 may be formed on the substrate structure 100, for example, on the buffer layer 104. In an embodiment where the control unit 110 is a transistor, the semiconductor layer 112 may include a channel layer. The formation of the semiconductor layer 112 may include a deposition process and a patterning process. The deposition process may include, for example, physical vapor deposition (PVD), chemical vapor deposition (CVD), atomic layer deposition (ALD), other suitable processes, or combinations thereof, but is not limited thereto. The patterning process includes suitable lithography and/or etching processes. The lithography process may include resist coating (e.g., spin-on coating), soft baking, mask alignment, exposure, post-exposure bake, resist development, rinsing, drying (e.g., spin-drying and/or hard baking), other suitable lithography techniques, or a combination thereof, but not limited thereto. The etching process may include dry etching (for example, RIE etching), wet etching, other etching methods, or a combination thereof, but not limited thereto.

Next, the first insulating layer 106 may be formed on the semiconductor layer 112. The process for forming the first insulating layer 106 may include, for example, physical vapor deposition (PVD), chemical vapor deposition (CVD), atomic layer deposition (ALD), other suitable processes, or a combination thereof, but is not limited thereto. Next, a gate 114 and a source/drain 116 may be formed on the first insulating layer 106. The process for forming the gate 114 and the source/drain 116 may include, for example, physical vapor deposition (PVD), chemical vapor deposition (CVD), atomic layer deposition (ALD), electroplating, other suitable processes, or a combination thereof, but not limited to this. Between the formation of the gate 114 and the source/drain 116, a second insulating layer 108 may be formed on the first insulating layer 106 and the gate 114. In some embodiments, a portion of the first insulating layer 106 and the second insulating layer 108 are removed through an etching process to expose the semiconductor layer 112, and then a conductive material for the source/drain 116 is deposited in openings left by removing the portion of the first insulating layer 106 and the second insulating layer 108. The second insulating layer 108 may be formed by a deposition process similar to that of the first insulating layer 106, which is not described in detail here for simplicity.

It should be understood that the present disclosure does not limit the formation sequence of each part of the control element 110 (such as the semiconductor layer 112, the gate 114, and the source/drain 116) and each insulating layer (such as the first insulating layer 106 and the second insulating layer 108). Those with ordinary skill in the art may adjust the formation sequence of the above layers according to the requirements of the manufacturing process. In addition, it should be understood that the present disclosure does not limit when to form the stress adjustment layer 105. Those skilled in the art may form the stress adjustment layer 105 before, during, or after the formation of the control unit 110 according to the requirements of the process.

Figure 5C:
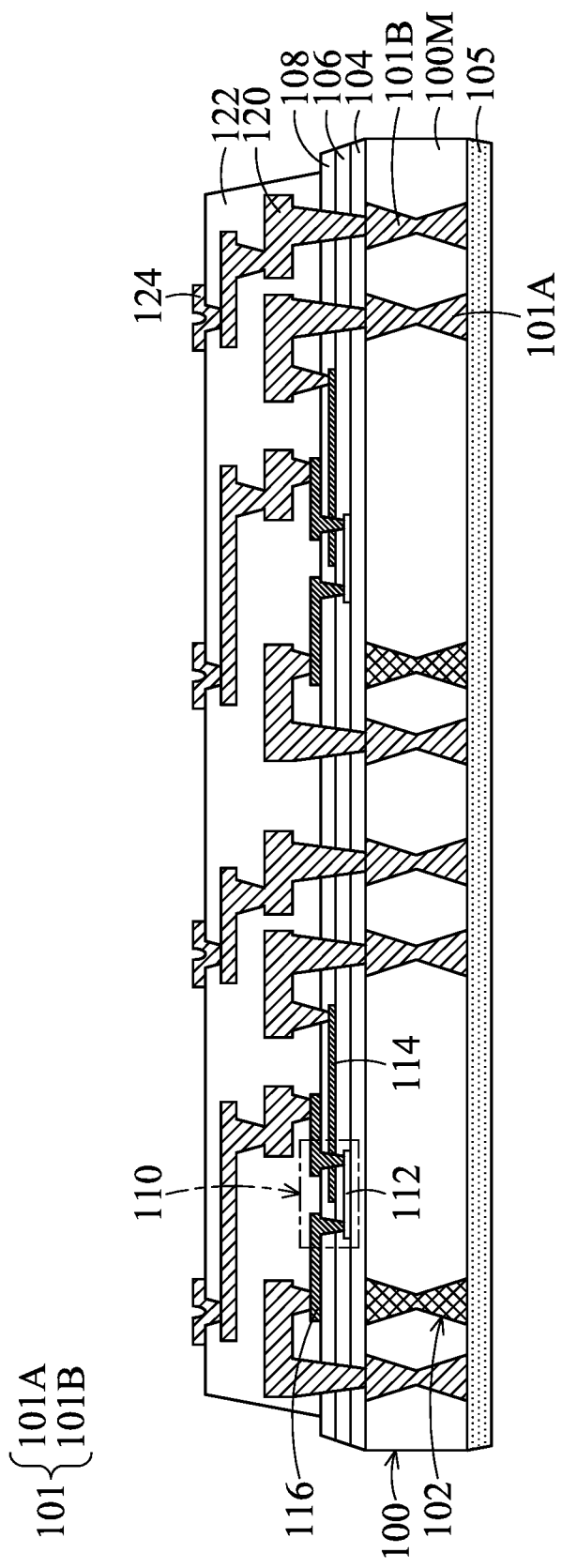

Referring next to FIG. 5C, a first circuit structure 120 electrically connected to the conductive via pattern 101 may be formed, and the dummy via pattern 102 is electrically insulated from the first circuit structure 120. Before, during, or after the formation of the first circuit structure 120, a dielectric material may be deposited to form a first dielectric layer 122 surrounding the first circuit structure 120. The process for depositing the first circuit structure 120 may include, for example, physical vapor deposition (PVD), chemical vapor deposition (CVD), atomic layer deposition (ALD), electroplating, other suitable processes, or combinations thereof, but not limited to this. The process for forming the first dielectric layer 122 may include, for example, physical vapor deposition (PVD), chemical vapor deposition (CVD), atomic layer deposition (ALD), other suitable processes, or a combination thereof, but not limited to this.

As shown in FIG. 5C, in order to dispose an electronic unit 130 on the first circuit structure 120, an alignment component 124 with a cavity facing away from the first circuit structure 120 may be formed on the first circuit structure 120. The alignment component 124 may formed by forming an opening exposing the first circuit structure 120 on the first dielectric layer 122 and forming a conductive material in the opening. The formation of the alignment component 124 may include a deposition process and a patterning process.

The deposition process of the alignment component 124 may include, for example, physical vapor deposition (PVD), chemical vapor deposition (CVD), atomic layer deposition (ALD), other suitable processes, or a combination thereof, but not limited thereto. The patterning process of the alignment component 124 includes suitable lithography and/or etching processes. The lithography process may include resist coating (e.g., spin-on coating), soft baking, mask alignment, exposure, post-exposure bake, resist development, rinsing, drying (e.g., spin-drying) and/or hard baking, other suitable lithography techniques, or a combination thereof, but not limited thereto. The etching process may include dry etching (for example, RIE etching), wet etching, other etching methods, or a combination thereof, but not limited thereto. In some embodiments, the resulted alignment component 124 may have a top portion that is higher than a top surface of the first dielectric layer 122.

Figure 5D:
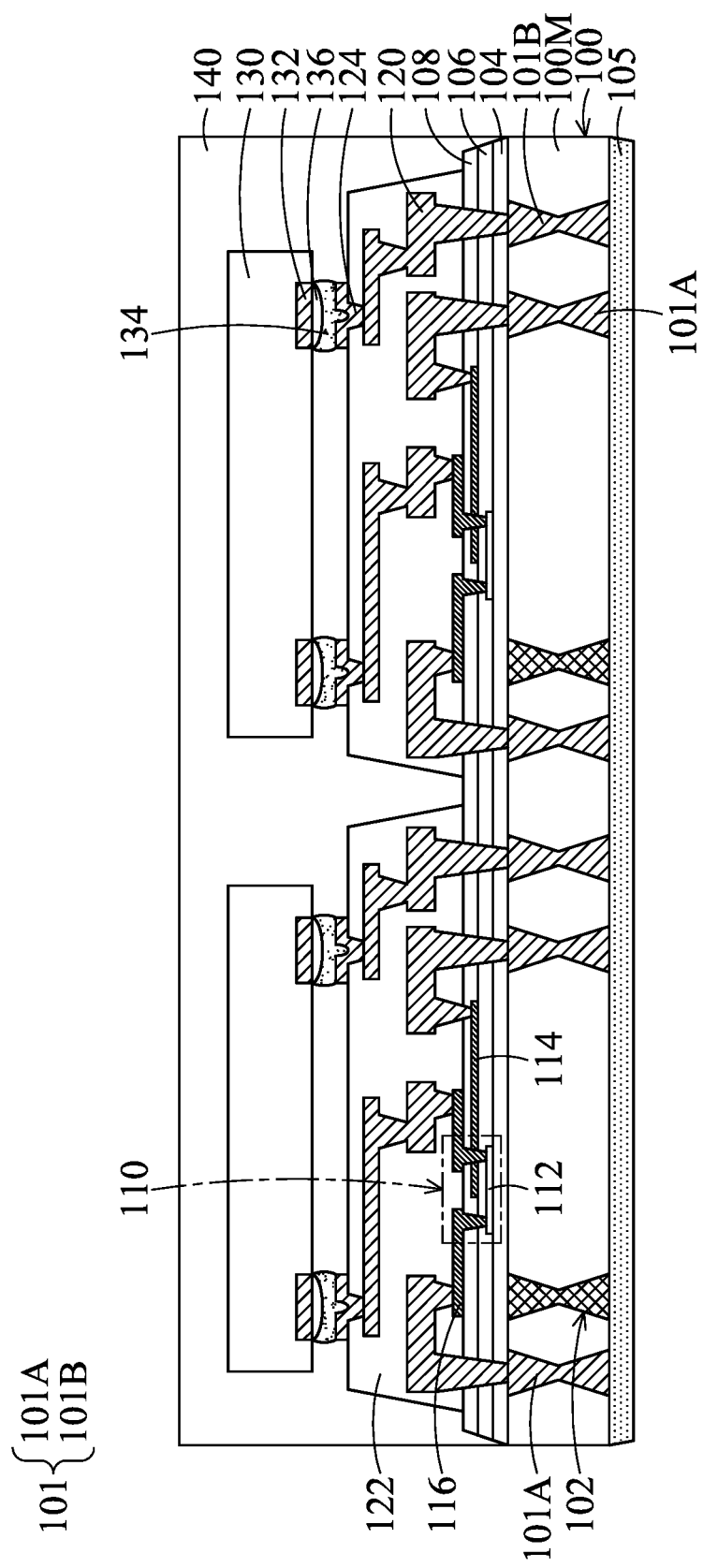

Referring to FIG. 5D, the electronic unit 130 is disposed on the first circuit structure 120, and the electronic unit 130 is electrically connected to the control unit 110 through the first circuit structure 120. The disposition of the electronic unit 130 may include aligning any portion of the electronic unit 130 with the alignment component 124. For example, in some embodiments, the electrical connection portion 132 of the electronic unit 130 is aligned with the alignment member 124. Then, a heating step may be performed to bond the alignment component 124 and the electrical connection portion 132 through the bonding material 134. After the electronic unit 130 is disposed, a protection layer 140 surrounding the electronic unit 130 may be formed. The process for forming the protection layer 140 may include, for example, physical vapor deposition (PVD), chemical vapor deposition (CVD), atomic layer deposition (ALD), other suitable processes, or combinations thereof, but is not limited thereto.

In some embodiments, the control unit 110 is formed after the electronic unit 130 and the protection layer 140 are formed. More specifically, the protection layer 140 surrounding the electronic unit 130 may be formed in the electronic device where the control unit 110 has not been formed, and then the entire electronic device is flipped over and the control unit 110 is formed on the other side of the substrate structure 100. In this way, an electronic device similar to that shown in FIG. 3 may be formed, wherein the substrate structure 100 is located between the electronic unit 130 and the control unit 110. Through the above design, it is possible to prevent the control unit 110 from interfering with the electronic unit 130 during operation, but not limited thereto.

In some embodiments, before forming the control unit 110, the first circuit structure 120, and the electronic unit 130, a conductive material 160 electrically connected to the conductive via pattern 101 is formed on the substrate structure 100 first. In this case, the protection layer 140 surrounding the electronic unit 130 may be formed first, and then the first circuit structure 120 is bonded to the conductive via pattern 101 of the substrate structure 100 with the conductive material 160. In this way, an electronic device 40 including the conductive material 160 as shown in FIG. 4 may be formed. Through the above design, the process complexity of forming the first circuit structure 120 and the second circuit structure 150 on the upper and lower sides of the substrate structure 100 can be reduced, but not limited thereto.

Figure 5E:
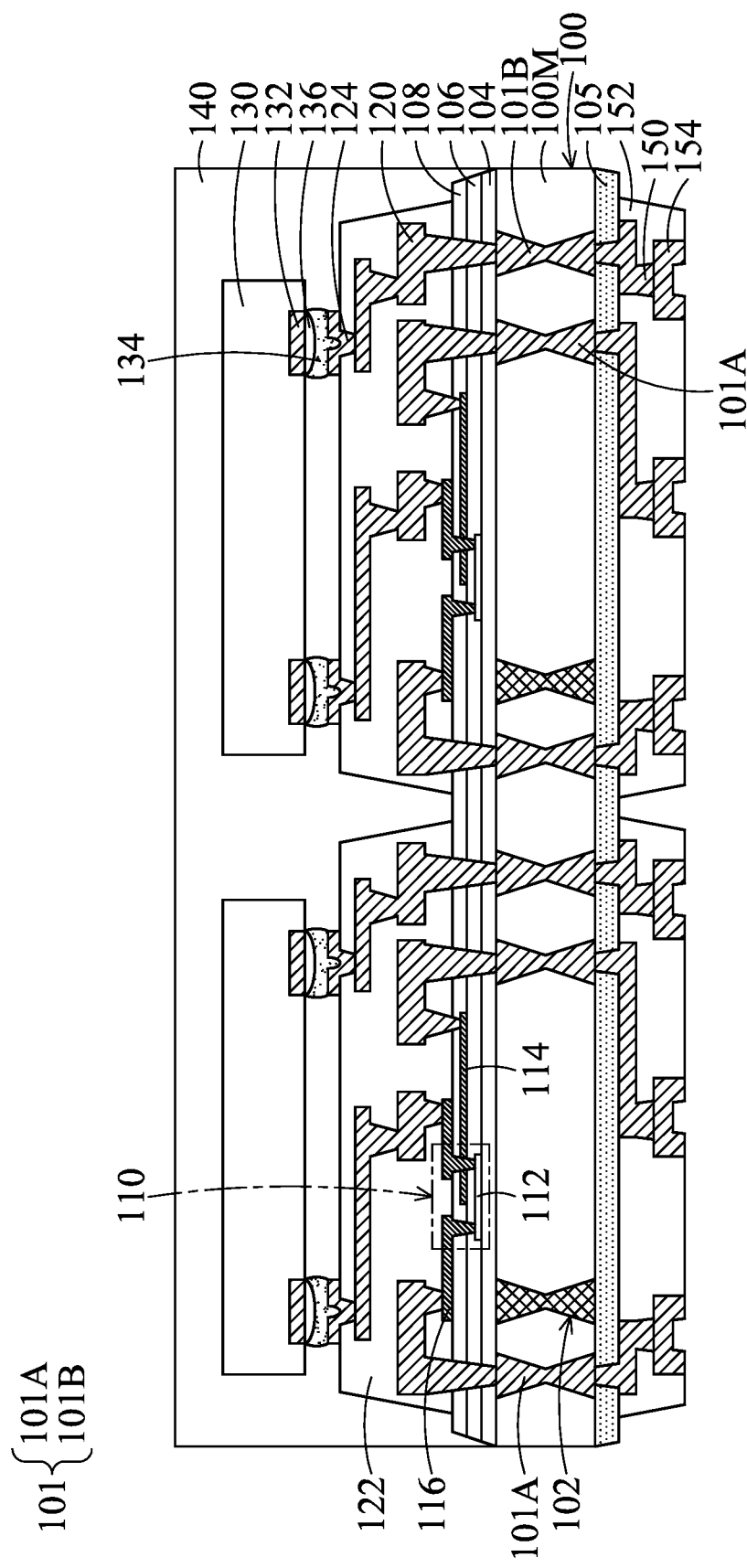

Next, referring to FIG. 5E, the formation of the electronic device may further include forming a second circuit structure 150 disposed on the substrate structure 100 and opposite to the first circuit structure 120, and the dummy via pattern 102 is electrically insulated from the second circuit structure 150. Before, during, or after the formation of the second circuit structure 150, a dielectric material may be deposited to form a second dielectric layer 152 surrounding the second circuit structure 150. The process for depositing the second circuit structure 150 may be similar to that of the first circuit structure 120 and is not further described here for simplicity. The process for depositing the second dielectric layer 152 may be similar to that of the first dielectric layer 122, which is not further described here for simplicity.

As shown in FIG. 5E, an alignment component 154 having a cavity facing away from the second circuit structure 150 may be formed on the second circuit structure 150. The alignment component 154 may be formed by forming an opening exposing the second circuit structure 150 on the second dielectric layer 152 and depositing a conductive material in the opening. The process for depositing the conductive material of the alignment component 154 may be similar to that of the alignment component 124, and is not otherwise described here for simplicity.

Figure 5F:
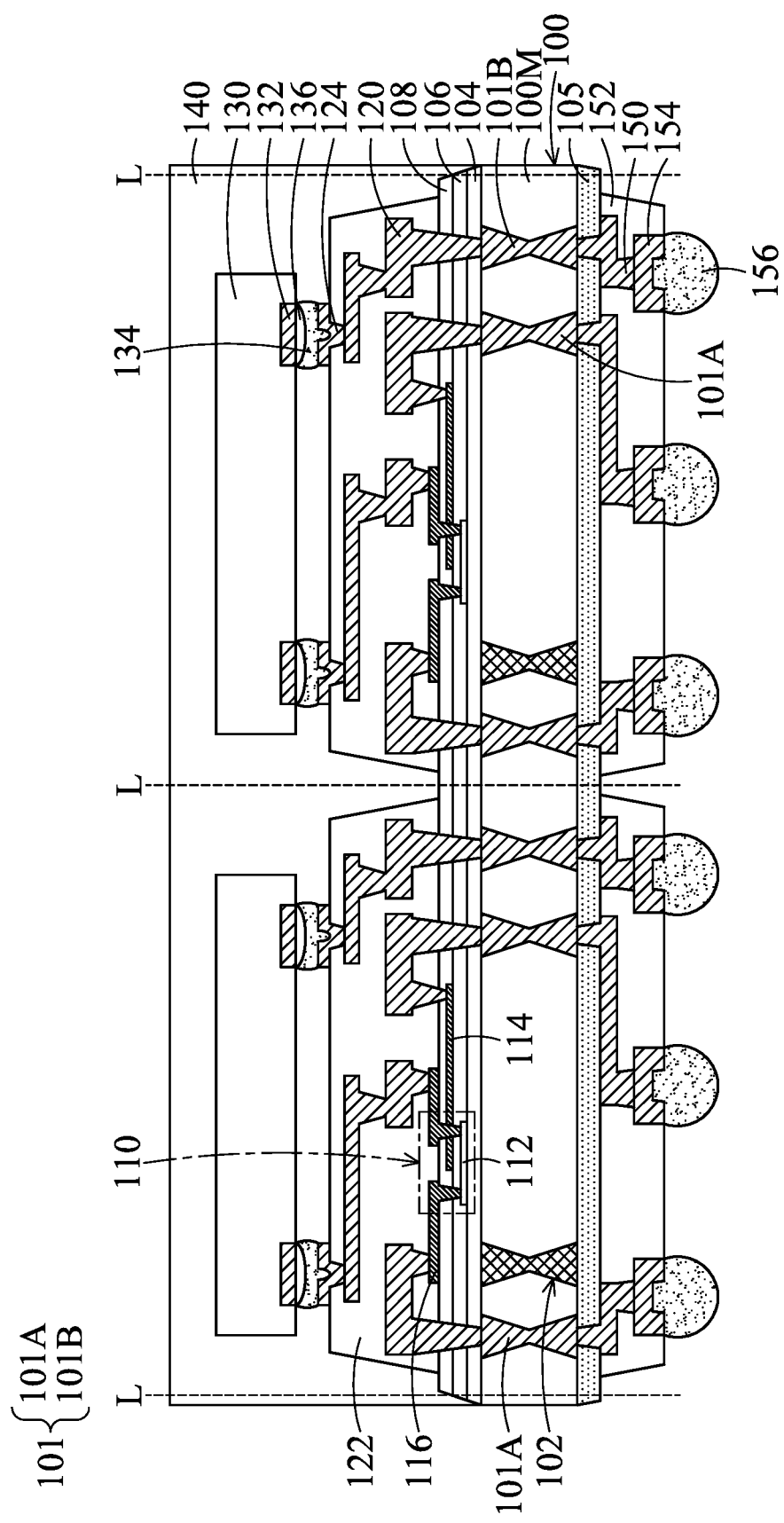

Referring next to FIG. 5F, a bonding material 156 may be formed on the alignment component 154. By forming the bonding material 156, the resulted electronic device can be bonded to an external circuit through heating. In some embodiments, after the electronic device array including a plurality of electronic units 130 is formed, the electronic device array is diced with, for example, the cutting line L in FIG. 5F to form a plurality of electronic devices. Depending on the design requirements of each electronic device after dicing, each electronic unit 130 may be the same, similar, or different types of elements, which is not limited in the present disclosure.

It should be understood that the features in various embodiments of the present disclosure may be arbitrarily mixed and matched as long as they do not violate the spirit of the invention or conflict.

In summary, the present disclosure provides an electronic device and a method for forming the same. By forming a dummy via pattern in a substrate structure, the substrate structure can be prevented from warping due to uneven stress. Compared with conventional packaging structures of electronic devices, the electronic device disclosed in this disclosure can maintain the stability of the substrate structure without affecting the electrical requirements, and packaging structures formed by such electronic device may improve the functionality of the electronic unit through a via structure and a control unit. In addition, the formation of a dummy via structure electrically insulated from a circuit structure can be integrated into the fabrication process of a conductive via pattern. Therefore, the formation method of the present disclosure can manufacture electronic devices with better electrical and structural properties, or do not need to perform complicated manufacturing steps, thereby saving manufacturing costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
   a substrate structure having a conductive via pattern and a dummy via pattern;
   a control unit electrically connected to the conductive via pattern;
   a first circuit structure electrically connected to the conductive via pattern; and
   an electronic unit electrically connected to the control unit through the first circuit structure,
   wherein the dummy via pattern is electrically insulated from the first circuit structure.

2. The electronic device as claimed in claim 1, wherein the conductive via pattern comprises:
   a first conductive via electrically connected to the control unit through the first circuit structure; and
   a second conductive via electrically connected to the electronic unit through a portion of the first circuit structure separated from the control unit.

3. The electronic device as claimed in claim 1, further comprising:
   a second circuit structure disposed on the substrate structure and opposite to the first circuit structure,
   wherein the dummy via pattern is electrically insulated from the second circuit structure.

4. The electronic device as claimed in claim 3, wherein the first circuit structure and the second circuit structure are electrically connected through the conductive via pattern.

5. The electronic device as claimed in claim 1, further comprising:
   a stress adjustment layer disposed on the substrate structure and located on a side of the substrate structure opposite from the control unit,
   wherein the stress adjustment layer covers a bottom surface of the dummy via pattern.

6. The electronic device as claimed in claim 1, wherein the control unit is located above the substrate structure, and the control unit is located between the substrate structure and the first circuit structure.

7. The electronic device as claimed in claim 1, wherein the control unit is located below the substrate structure, and the substrate structure is located between the control unit and the first circuit structure.

8. The electronic device as claimed in claim 1, further comprising a protection layer surrounding the electronic unit.

9. The electronic device as claimed in claim 1, wherein the substrate structure comprises a transparent material.

10. The electronic device as claimed in claim 1, wherein the conductive via pattern and the dummy via pattern comprise a same material.

11. The electronic device as claimed in claim 1, further comprising:
an alignment component disposed on the first circuit structure and electrically connected to the electronic unit,
wherein the alignment component has a cavity facing the electronic unit.

12. The electronic device as claimed in claim 1, further comprising:
a buffer layer disposed between the substrate structure and the control unit,
wherein the buffer layer covers a top surface of the dummy via pattern.

13. The electronic device as claimed in claim 12, wherein the first circuit structure penetrates through the buffer layer to be electrically connected to the conductive via pattern.

14. A method for forming an electronic device, comprising:
forming a substrate structure having a conductive via pattern and a dummy via pattern;
forming a control unit electrically connected to the conductive via pattern;
forming a first circuit structure electrically connected to the conductive via pattern; and
disposing an electronic unit on the first circuit structure, wherein the electronic unit is electrically connected to the control unit through the first circuit structure,
wherein the dummy via pattern is electrically insulated from the first circuit structure.

15. The method for forming an electronic device as claimed in claim 14, further comprising forming a second circuit structure opposite to the first circuit structure on the substrate structure, wherein the dummy via pattern is electrically insulated from the second circuit structure.

16. The method for forming an electronic device as claimed in claim 14, wherein the conductive via pattern and the dummy via pattern are formed simultaneously in a deposition process.

17. The method for forming an electronic device as claimed in claim 14, further comprising forming a buffer layer covering a top surface of the dummy via pattern before forming the control unit.

18. The method for forming an electronic device as claimed in claim 17, further comprising forming a stress adjustment layer on a side of the substrate structure opposite to the buffer layer, wherein a thickness of the stress adjustment layer is greater than a thickness of the buffer layer.

19. The method for forming an electronic device as claimed in claim 14, further comprising forming a protection layer surrounding the electronic unit, wherein the control unit is formed after forming the electronic unit and the protection layer.

20. The method for forming an electronic device as claimed in claim 19, wherein the substrate structure is located between the electronic unit and the control unit.

* * * * *